(12) United States Patent
Kinsman et al.

(10) Patent No.: US 6,396,131 B1
(45) Date of Patent: May 28, 2002

(54) STRESS REDUCTION FEATURE FOR LOC LEAD FRAME

(75) Inventors: Larry D. Kinsman; Timothy J. Allen, both of Boise; Jerry M. Brooks, Caldwell, all of ID (US)

(73) Assignee: Micron Technology, Inc., Boise, ID (US)

( * ) Notice: Subject to any disclaimer, the term of this patent is extended or adjusted under 35 U.S.C. 154(b) by 994 days.

(21) Appl. No.: 08/923,218

(22) Filed: Sep. 4, 1997

Related U.S. Application Data

(63) Continuation of application No. 08/614,618, filed on Mar. 13, 1996.

(51) Int. Cl.[7] .............................................. H01L 23/495
(52) U.S. Cl. ....................................... 257/669; 257/676
(58) Field of Search ................................ 257/666, 668, 257/669, 674, 676

(56) References Cited

U.S. PATENT DOCUMENTS

| | | | |
|---|---|---|---|
| 3,750,277 A | 8/1973 | Happ | |
| 4,209,355 A | * 6/1980 | Burns | .......................... 156/630 |
| 4,984,059 A | 1/1991 | Kubota et al. | |
| 5,068,712 A | * 11/1991 | Murakami et al. | ............ 357/72 |
| 5,126,820 A | 6/1992 | Brown | |
| 5,227,661 A | 7/1993 | Heinen | |
| 5,231,303 A | * 7/1993 | Kasahara et al. | ........... 257/669 |
| 5,233,220 A | 8/1993 | Lamson et al. | |
| 5,381,037 A | 1/1995 | Olivarez | |
| 5,384,487 A | 1/1995 | Rostoker et al. | |
| 5,418,189 A | 5/1995 | Heinen | |
| 5,466,888 A | 11/1995 | Beng et al. | |
| 5,531,860 A | 7/1996 | Li | |
| 5,545,921 A | 8/1996 | Conru et al. | |

\* cited by examiner

Primary Examiner—Douglas A. Wille
(74) Attorney, Agent, or Firm—TraskBritt

(57) ABSTRACT

An LOC die assembly is disclosed including a die dielectrically adhered to the underside of a lead frame. The lead frame has stress relief slots formed in the undersides of the lead elements proximate the adhesive to accommodate filler particles lodged between the leads and the active surface of the die during transfer molding of a plastic encapsulant. The increased space created by the slots and flexure in the leads about the slots reduces point stresses on the active surface of the die by the filler particles. The increased flexure in the leads about the slots further enhances the locking of the leads in position with respect to the die.

17 Claims, 8 Drawing Sheets

STRESS REDUCTION FEATURE FOR LOC LEAD FRAME

This application is a continuation divisional continuation-in-part of application Ser. No. 08/614,618, filed Mar. 13, 1996.

BACKGROUND OF THE INVENTION

1. Field of the Invention

The invention pertains to a "leads over chip" (LOC) semiconductor die assembly, and more particularly to a method and apparatus for reducing the stress resulting from lodging of filler particles present in plastic encapsulants between the undersides of the lead frame leads and the active surface of the die and improved lead locking of the leads in position over a portion of the active surface of a semiconductor die assembly.

2. State of the Art

The use of LOC semiconductor die assemblies has become relatively common in the industry in recent years. This style or configuration of semiconductor device replaces a "traditional" lead frame with a central, integral support (commonly called a die-attach tab, paddle, or island) to which the back surface of a semiconductor die is secured, with a lead frame arrangement wherein the dedicated die-attach support is eliminated and at least some of the leads extend over the active surface of the die. The die is then adhered to the lead extensions with an adhesive dielectric layer of some sort disposed between the undersides of the lead extensions and the die. Early examples of LOC assemblies are illustrated in U.S. Pat. No. 4,862,245 to Pashby et al. and U.S. Pat. No. 4,984,059 to Kubota et al. More recent examples of the implementation of LOC technology are disclosed in U.S. Pat. Nos. 5,184,208; 5,252,853; 5,286,679; 5,304,842; and 5,461,255. In instances known to the inventors, LOC assemblies employ large quantities or horizontal cross-sectional areas of adhesive to enhance physical support of the die for handling.

Traditional lead frame die assemblies using a die-attach tab place the inner ends of the lead frame leads in close lateral proximity to the periphery of the active die surface where the bond pads are located, wire bonds then being formed between the lead ends and the bond pads. LOC die assemblies, by their extension of inner lead ends over the die, permit physical support of the die from the leads themselves, permit more diverse (including centralized) placement of the bond pads on the active surface, and permit the use of the leads for heat transfer from the die. However, use of LOC die assemblies in combination with plastic packaging of the LOC die assembly has demonstrated some shortcomings of LOC technology as presently practiced in the art.

One of the short comings of the prior art LOC semiconductor die assemblies is that the tape used to bond to the lead fingers of the lead frame does not adequately lock the lead fingers in position for the wire bonding process. At times, the adhesive on the tape is not strong enough to fix or lock the lead fingers in position for wire bonding as the lead fingers pull away from the tape before wire bonding. Alternately, the lead fingers will pull away from the tape after wire bonding of the semiconductor die but before encapsulation of the semiconductor die and frame either causing shorts between adjacent wire bonds or the wire bonds to pull loose from either the bond pads of the die or lead fingers of the frame.

After wire bonding the semiconductor die to the lead fingers of the lead frame forming an assembly, the most common manner of forming a plastic package about a die assembly is molding, and, more specifically, transfer molding. In this process (and with specific reference to LOC die assemblies), a semiconductor die is suspended by its active surface from the underside of inner lead extensions of a lead frame (typically Cu or Alloy 42) by a tape, screen print or spin-on dielectric adhesive layer. The bond pads of the die and the inner lead ends of the frame are then electrically connected by wire bonds (typically Au, although Al and other metal alloy wires have also been employed) by means known in the art. The resulting LOC die assembly, which may comprise the framework of a dual-in-line package (DIP), zig-zag in-line package (ZIP), small outline j-lead package (SOJ), quad flat pack (QFP), plastic leaded chip carrier (PLCC), surface mount device (SMD) or other plastic package configuration known in the art, is placed in a mold cavity and encapsulated in a thermosetting polymer which, when heated, reacts irreversibly to form a highly cross-linked matrix no longer capable of being re-melted.

The thermosetting polymer generally is comprised of three major components: an epoxy resin, a hardener (including accelerators), and a filler material. Other additives such as flame retardants, mold release agents and colorants are also employed in relatively small amounts.

While many variations of the three major components are known in the art, the focus of the present invention resides in the filler materials employed and its effects on the active die surface and improved lead locking of the lead fingers of the frame.

Filler materials are usually a form of fused silica, although other materials such as calcium carbonates, calcium silicates, talc, mica and clays have been employed for less rigorous applications. Powdered fused quartz is currently the primary filler used in encapsulants. Fillers provide a number of advantages in comparison to unfilled encapsulants. For example, filers reinforce the polymer and thus provide additional package strength, enhance thermal conductivity of the package, provide enhanced resistance to thermal shock, and greatly reduce the cost of the polymer in comparison to its unfilled state. Fillers also beneficially reduce the coefficient of thermal expansion (CTE) of the composite material by about fifty percent in comparison to the unfilled polymer, resulting in a CTE much closer to that of the silicon or gallium arsenide die. Filler materials, however, also present some recognized disadvantages, including increasing the stiffness of the plastic package, as well as the moisture permeability of the package.

Another previously unrecognized disadvantage discovered by the inventors herein is the damage to the active die surface resulting from encapsulant filler particles becoming lodged or wedged between the underside of the lead extensions and the active die surface during transfer molding of the plastic package about the die and the inner lead ends of the LOC die assembly. The filler particles, which may literally be jammed in position due to deleterious polymer flow patterns and flow imbalances in the mold cavity during encapsulation, place the active die surface under residual stress at the points of contact of the particles. The particles may then damage the die surface or conductive elements thereon or immediately thereunder when the package is further stressed (mechanically, thermally, electrically) during post-encapsulation handling and testing.

While it is possible to employ a lower volume of filler in the encapsulating polymer to reduce potential for filler particle lodging or wedging, a drastic reduction in filler volume raises costs of the polymer to unacceptable levels.

Currently available filler technology also imposes certain limitations as to practical beneficial reductions in particle size (currently in the 75 to 125 micron range, with the larger end of the range being easier to achieve with consistency) and in the shape of the filler particles. While it is desirable that particles be of generally spherical shape, it has thus far proven impossible to eliminate non-spherical flakes or chips which, in the wrong orientation, maximize stress on the die surface.

Ongoing advances in design and manufacturing technology provide increasingly thinner conductive, semiconductive and dielectric layers in state-of-the-art die, and the width and pitch of conductors serving various purposes on the active surface of the die are likewise being continually reduced. The resulting die structures, while robust and reliable for their intended uses, must nonetheless become more stress-susceptible due to the minimal strength provided by the minute widths, depths and spacings of their constituent elements. The integrity of active surface die coats such as silicon dioxide, doped silicon dioxides such as phosphorous silicate glass (PSG) or borophosphorous silicate glass (BPSG), or silicon nitride, may thus be compromised by point stresses applied by filler particles, the result being unanticipated shortening of device life if not immediate, detectable damage or alteration of performance characteristics.

The aforementioned U.S. Pat. No. 4,984,059 to Kubota et al. does incidentally disclose several exemplary LOC arrangements which appear to greatly space the leads over the chip or which do not appear to provide significant areas for filler particle lodging. However, such structures may create fabrication and lead spacing and positioning difficulties.

In addition to solving the problems associated with filler particle lodging and damage, it is desirable to have improved lead locking of the lead fingers of the frame during operations involving the semiconductor die. If the lead fingers have increased flexibility, the adhesive used to bond the lead frame to the semiconductor die is more effective in locking the lead fingers in position. Previously, improving lead finger locking has been approached from the perspective of improved adhesives, rather than increasing the flexibility of the lead fingers.

From the foregoing, the prior art has neither provided for improved locking of the lead fingers to the semiconductor die, nor recognized the stress phenomenon attendant to transfer molding and the use of filled encapsulants, nor provided an LOC structure which beneficially accommodates this phenomenon.

SUMMARY OF THE INVENTION

The present invention provides a lead-supported die assembly for an LOC arrangement that substantially reduces the stress that may otherwise potentially form between the leads and the active die surface due to the presence of filler particles of the polymer encapsulant and improved lead locking of the leads in position over a portion of the active surface of a semiconductor die assembly. Accordingly, each lead of the lead frame between the bonding location of the die and the edge of the die is formed with a stress relief portion therein. The resulting enlarged volume of space between the leads and the active die surface will beneficially accommodate an increased amount of the underlying filler particle or particles of the polymer encapsulant. Accordingly, a stacking of filler particles in which the filler particles try to force the lead away from the die thus causing stress in the connection between the lead and the die is less likely to occur. Moreover, this stress relief portion allows flexibility in bending and torsion in the leads due to stress created during the transfer molding process as well as other processes. The resulting lead flexure in response to the filler material will produce an immediate reduction in the residual stress experienced by the active die surface. This lessened residual stress is carried forward in the encapsulated package after cure, permitting the package to better withstand the stresses of post-encapsulation handling and testing, including the elevated potentials and temperatures experienced during burn-in, without adverse effects. The resulting lead flexure also allows improved lead finger locking to the tape as less force is transferred to the tape from the flexure of the lead fingers which force may cause the lead fingers to become dislodged therefrom prior to the wire bonding operations or, subsequently, during encapsulation of the assembly.

The LOC apparatus of the present invention comprises a lead frame to which the active surface of a die is adhered by a LOC tape, permitting the lead frame to physically support the die during pre-encapsulation handling and processing such as wire bonding. The free ends of the leads have a recessed portion formed therein extending over a longitudinal length of the lead end proximate the active surface of the die. With such an arrangement, intrusion of filler particles between the inner lead ends and the active surface of the die during the encapsulation process is beneficially accommodated.

Stated in more specific terms and on the scale of an individual lead and the underlying active surface of the die, proximate the dielectric adhesive (such as LOC tape, screen print or spin-on, as known in the art) disposed on the underside of a lead, the lead is minimized in cross-sectional area along the lead axis. The design permits an increased amount of filler particles to accumulate in this recessed area such that the filler is less likely to force the lead away from the die. Similarly, the lead may incorporate a arched or bowed portion proximate its bonding location to the die to accommodate an increased amount of filler particles between the lead an the active surface of the die. This design also permits the free end of the lead to flex in bending and torsion about this arched or bowed portion, so as to bend or twist as required while being retained in position by the tape or in the presence of a filler particle or particles lodged between that lead and the die.

It is contemplated, that this flexibility or stress reduction portion or filler particle accommodation portion of the lead frame may be formed in several manners. For example, a certain amount of each lead finger where flexibility, stress reduction or filler particle accommodation is desired may have a portion of its thickness chemically etched away. Likewise, various erosion, electron beam, machining or other processes known in the art may be utilized to reduce the thickness of the lead finger at the desired location. The reduced thickness portion of the lead finger for flexibility, stress reduction and filler particle accommodation may also be created by deformation, coining, stamping or other such methods known in the art to thin material.

DETAILED DESCRIPTION OF THE ILLUSTRATED EMBODIMENT

So that the reader may more fully understand the present invention in the context of the prior art, it seems appropriate to provide a brief description of a transfer apparatus and method for forming a plastic package about an LOC die assembly. The term "transfer" molding is descriptive of this process as the molding compound, once melted, is transferred under pressure to a plurality of remotely-located mold cavities containing die assemblies to be encapsulated.

Figure 1:
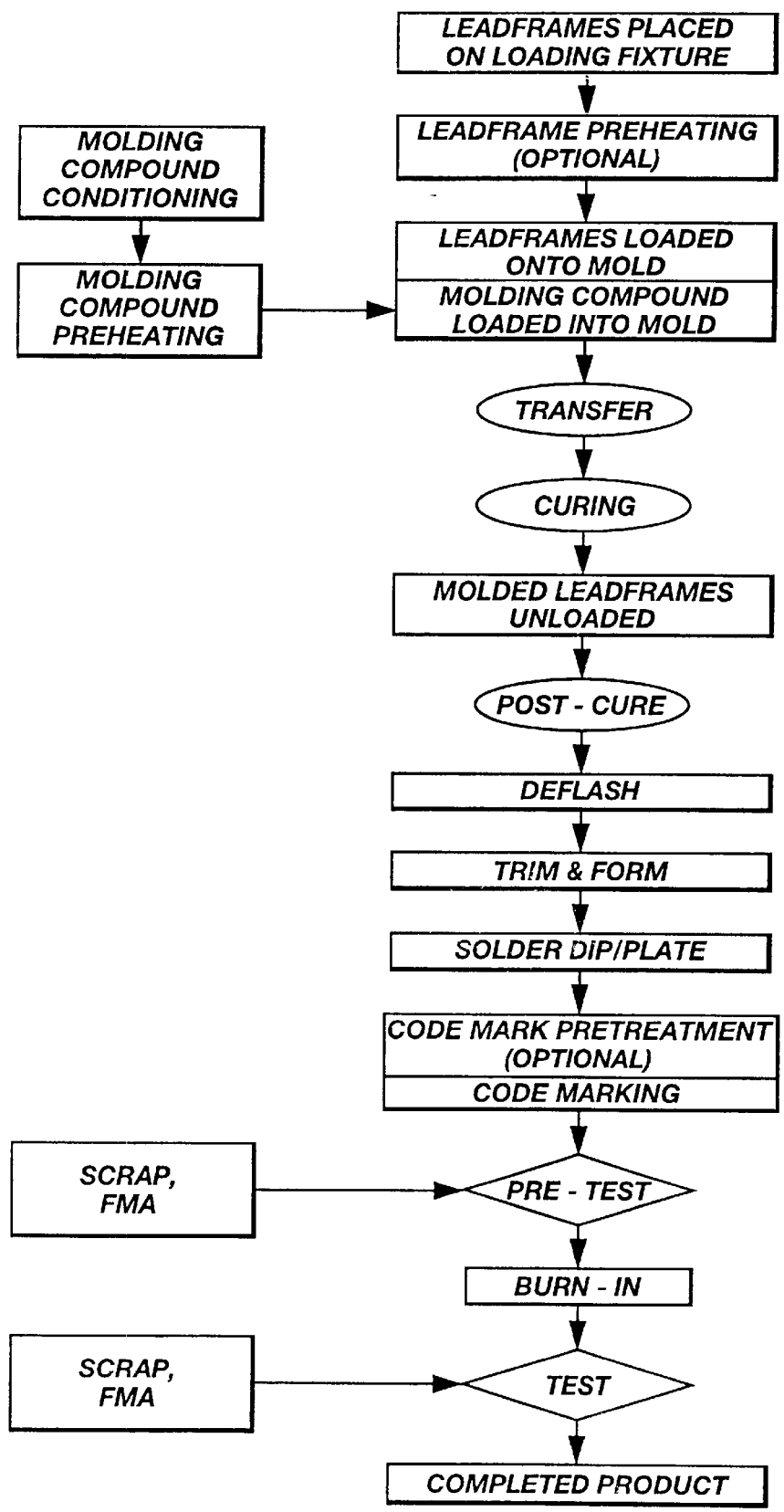
FIG. 1 comprises a flow chart of an exemplary process sequence for plastic package molding.

FIG. 1 is a flow chart of a typical process sequence for plastic package molding. It should be noted that the solder dip/plate operation has been shown as one step for brevity; normally plating would occur prior to trim and form.

Figure 2A:
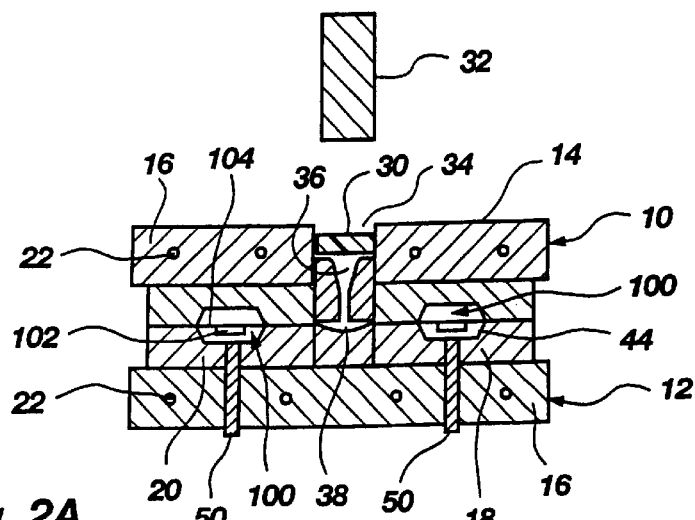
FIGS. 2A and 2B are side schematic views of a typical transfer molding, showing pre-molding and post-molding encapsulant positions.
Figure 2B:
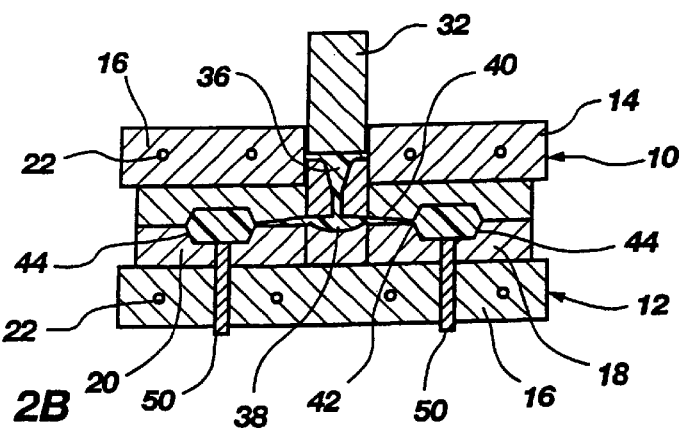
Figure 3:
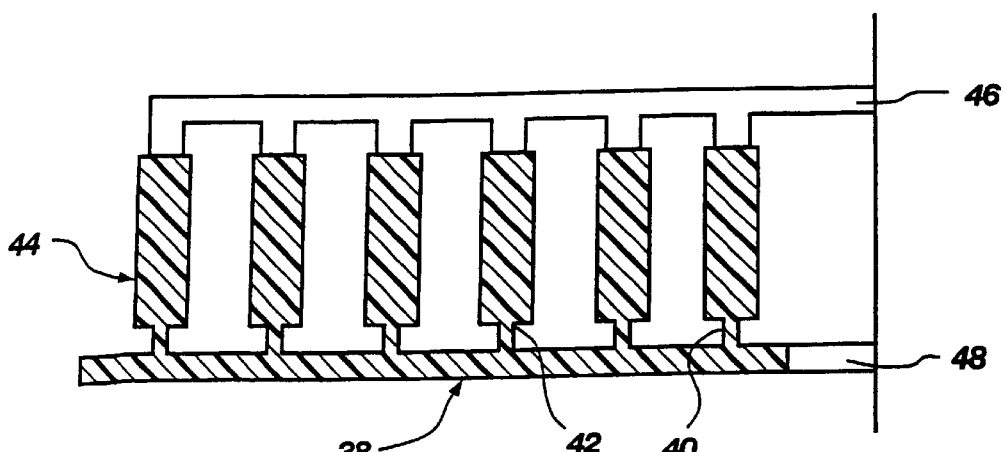
FIG. 3 shows a top schematic view of one side of a transfer mold of FIGS. 2A and 2B, depicting encapsulant flow and venting of the primary mold runner and the mold cavities wherein the die assemblies are contained.

FIGS. 2A and 2B show pre-molding and post-molding positions of encapsulant during a transfer molding operation using a typical mold apparatus comprising upper and lower mold halves 10 and 12, each mold half including a platen 14 or 16 with its associated chase 18 or 20. Heating elements 22 are employed in the platens to maintain an elevated and relatively uniform temperature in the runners and mold cavities during the molding operation. FIG. 3 shows a top view of one side of the transfer mold apparatus of FIGS. 2A and 2B. In the transfer mold apparatus shown, the encapsulant flows into each mold cavity 44 through the short end thereof.

In operation, a heated pellet of resin mold compound 30 is disposed beneath ram or plunger 32 in pot 34. The plunger descends, melting the pellet and forcing the melted encapsulant down through sprue 36 and into primary runner 38, from which it travels to transversely-oriented secondary runners 40 and across gates 42 into and through the mold cavities 44 through the short side thereof flowing across the die assemblies 100, wherein die assemblies 100 comprising dies 102 with attached lead frames 104 are disposed (usually in strips so that a strip of six lead frames, for example, would be cut and placed in and across the six cavities 44 shown in FIG. 3). Air in the runners 38 and 40 and mold cavities 44 is vented to the atmosphere through vents 46 and 48. At the end of the molding operation, the encapsulant is "packed" by application of a higher pressure to eliminate voids and reduce non-uniformities of the encapsulant in the mold cavities 44. After molding, the encapsulated die assemblies are ejected from the cavities 44 by ejector pins 50, after which they are post-cured at an elevated temperature to complete cross-linking of the resin, followed by other operations as known in the art and set forth in FIG. 1 by way of example. It will be appreciated that other transfer molding apparatus configurations, as well as variations in the details of the described method are known in the art. However, none of such are pertinent to the invention, and so will not be discussed herein.

Figure 4A:
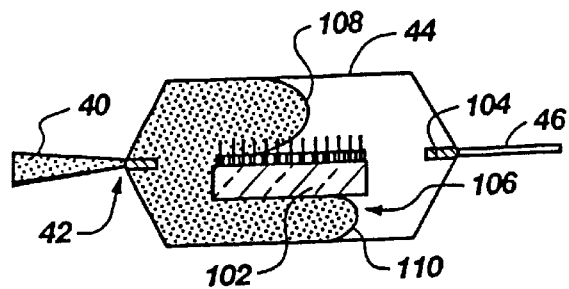
FIGS. 4A, 4B and 4C depict encapsulant flow scenarios for a mold cavity.
Figure 4B:
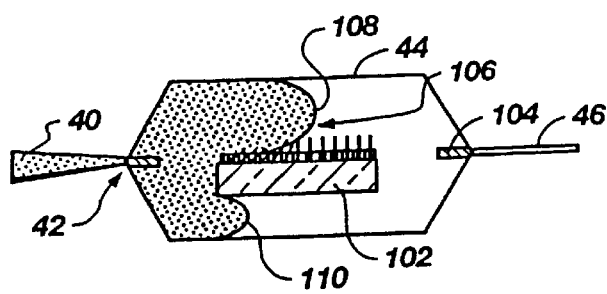
Figure 4C:
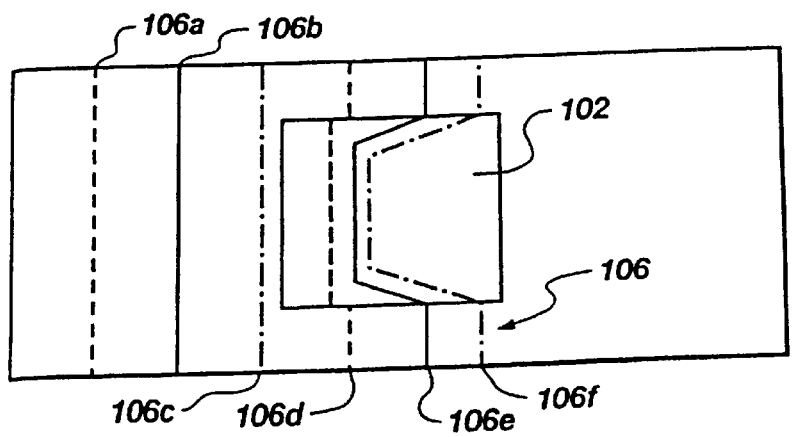

Encapsulant flow in the mold cavities 44 is demonstrably non-uniform. The presence of the die assembly 100 comprising a die 102 with lead frame 104 disposed across the mid-section of a cavity 44 splits the viscous encapsulant flow front 106 into upper 108 and lower 110 components. Further, the presence of the (relatively) large die 102 with its relatively lower temperature in the middle of a cavity 44 permits the flow front 106 on each side of the die 102 to advance ahead of the front which passes over and under the die 102. FIGS. 4A and 4B show two mold cavity encapsulant flow scenarios where, respectively, the lower flow front 110 and the upper flow front 108 lead the overall encapsulant flow front 106 in the cavity 44 containing the die assembly 100. FIG. 4C depicts the advance of a flow front 106 from above, before and after a die 102 is encountered, the flow being depicted as time-separated instantaneous flow fronts 106a, 106b, 106c, 106d, 106e and 106f.

Encapsulant filler particles, as noted above, become lodged between lead ends and the underlying die surfaces. The non-uniform flow characteristics of the viscous encapsulant flow, as described above, may cause (in addition to other phenomena, such as wire sweep, which are not relevant to the invention) particles to be more forcefully driven between the leads and the die and wedged or jammed in place in low-clearance areas. As the encapsulant flow front advances and the mold operation is completed by packing the cavities, pressure in substantially all portions of the cavities reaches hydrostatic. With prior art lead and adhesive LOC arrangements, the relative inflexibility of the tightly-constrained (adhered) lead ends maintains the point stresses of the particles trapped under the leads. These residual stresses are carried forward in the fabrication process to post-cure and beyond. When mechanical, thermal or electrical stresses attendant to post-encapsulation processing are added to the residual point stresses associated with the lodged filler particles, cracking or perforation of the die coat may occur, with the adverse effects previously noted. It has been observed that filler particle-induced damage occurs more frequently in close proximity to the adhesive, where lead flexure potential is at its minimum.

Figure 5A:
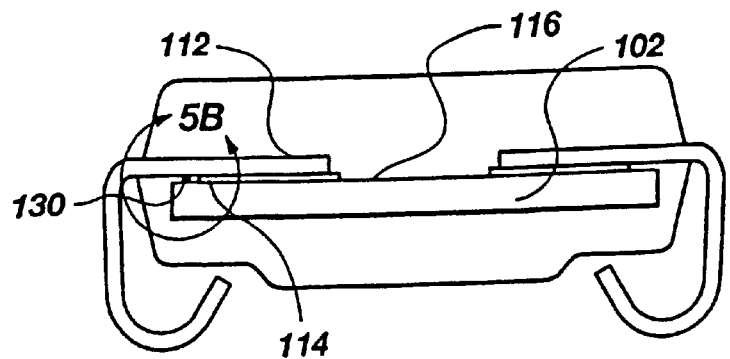
FIGS. 5A and 5B depict cross-sectional side views of prior art packaged SOJ semiconductor devices.
Figure 5B:
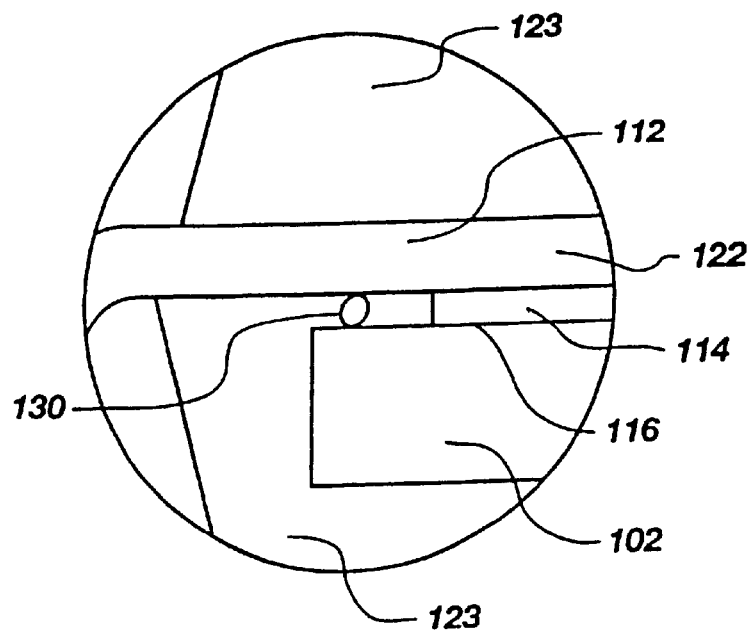

To graphically illustrate the above description of particle lodging, FIG. 5A depicts a prior art packaged LOC assembly wherein a single lead 112 extends over a die 102, with a segment of dielectric adhesive 114, in this instance a piece of Kapton™ polyamide tape, adhered to both the lead 112 and the active surface 116 of the die. As better illustrated in FIG. 5B (DETAIL A), filler particle 130, which is part of the packaging material 123, is lodged between lead 112 and die surface 116. It is clear that the lead end 122 is tightly constrained from movement by the inflexibility of the attachment of the lead end 122 to the die 102 by the adhesive 114. Moreover, the relative closeness of the lead 112 to the active surface 116 and the inability of the lead 112 to flex or relax to reduce stress occasioned by the presence of the filler particle 130 may continue even after the encapsulant has reached hydrostatic balance such that the filler particle 130 may become tightly lodged between the lead 112 and the active surface 116.

Figure 6A:
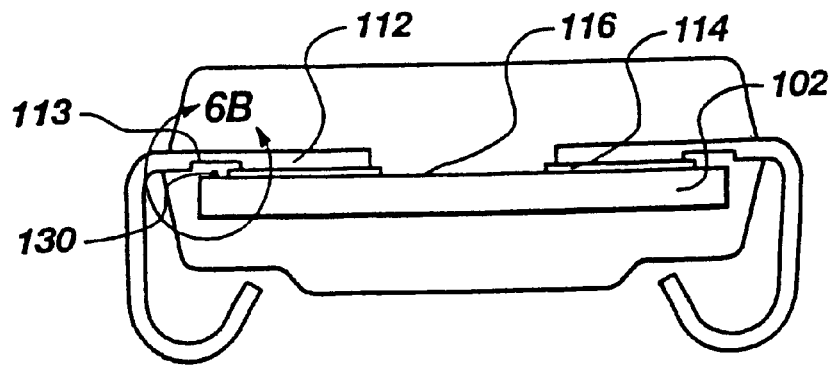
FIGS. 6A and 6B depict cross-sectional side views of a first embodiment of packaged SOJ semiconductor device according to the present invention.
Figure 6B:
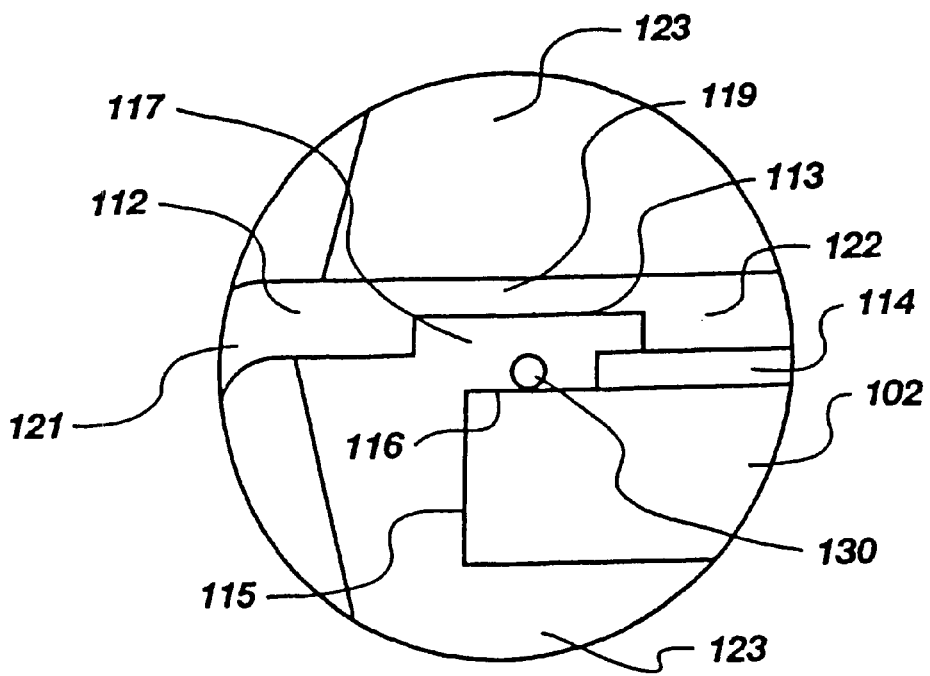

FIG. 6A, and in better detail FIG. 6B, depicts, in contrast to the prior art, a packaged LOC arrangement according to the present invention, wherein a single lead end 122 also extends over die 102. Instead of the tight lead-to-die constraint provided by the prior art lead member, a lead 112 having a slot or recess 113 formed therein by etching, machining, eroding, removing material with an electron beam, or other processes known in the art is utilized to reduce the thickness of the lead 112 proximate the active surface 116 of the die 102 between the portion of the lead end 122 attached to the adhesive 114 and the outer edge 115 of the die 102. The recess 113 creates an enlarged space 117, compared to the prior art device, between the active surface 116 and the lead 112. Thus, a filler particle 130, of same size and shape as that shown with respect to the prior art, while still positioned between the lead 112 and the active surface 116 cannot become lodged therebetween. Moreover, the stacking of such particles 130 to create a similar lodging effect is less likely to occur because of the increased space 117.

Additionally, because the recess 113 forms a thinned portion 119 along a longitudinal length of the lead 112, the free end 121 of the lead 112 can flex in both bending and twisting or torsion away from the active surface 116. Thus, a plurality of particles 130 that become stacked between the active surface 116 of the die 102 and the thinned portion 119 do not cause the same amount of residual stress to the die surface 116, due to the ability of the free end 121 to, in effect, relax and reach a steady state position under hydrostatic encapsulant pressure, which relaxation reduces the point stress of the particle contact with the die surface to an acceptable level. Furthermore, the ability of the lead 112 being able to flex allows improved lead locking in position by the adhesive 114.

Figure 7A:
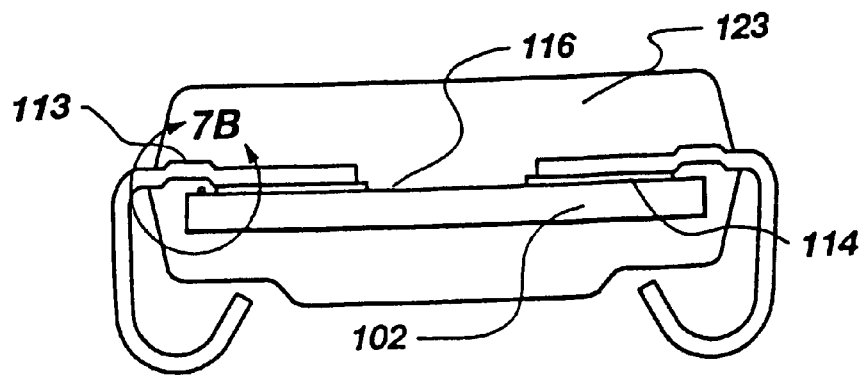
FIGS. 7A and 7B depict cross-sectional side views of a second embodiment of packaged SOJ semiconductor device according to the present invention.
Figure 7B:
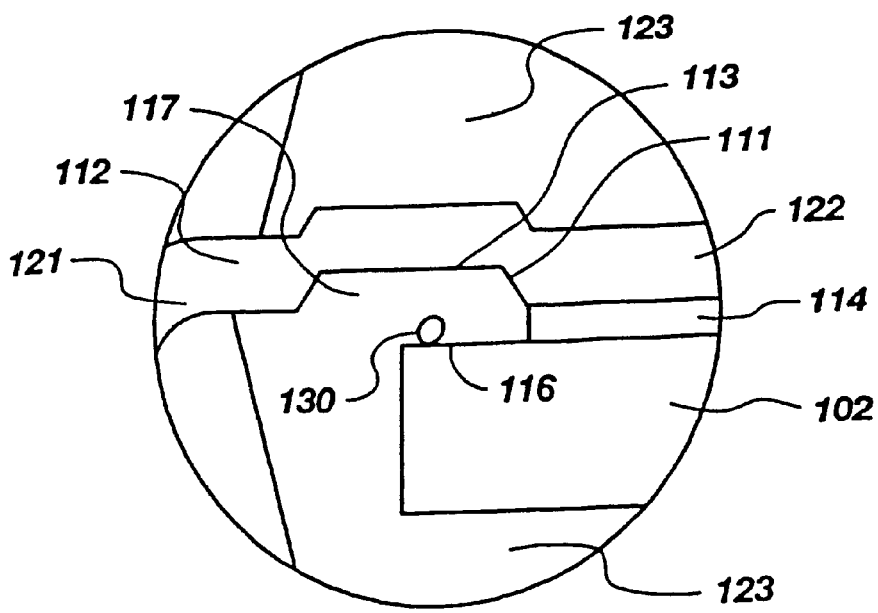

FIGS. 7A and 7B depict an alternative arrangement according to the present invention, wherein the recess 113 formed in the free end 121 of the lead 112 between the lead 112 and the active surface 116 of the die 102 is formed by bending, deforming, or otherwise arching the lead 112 by coining, stamping or other such methods known in the art. As in the embodiment shown in FIGS. 6A and 6B, this recessed portion 113 creates additional space between the lead 112 and the die surface 116 such that a particle 130 is less likely to become lodged therein. In addition, the free end 121 of the lead 112 is allowed to deflect about the lead end 122 at the flex point 111 to relieve stress created by stacking of particles 130 between the recess 113 and the surface 116 to reduce the magnitude of point-loading of the filler particle 130 against die surface 116. As previously stated, the ability of the lead 112 to flex improves the lead locking ability of the adhesive 114.

Figure 8A:
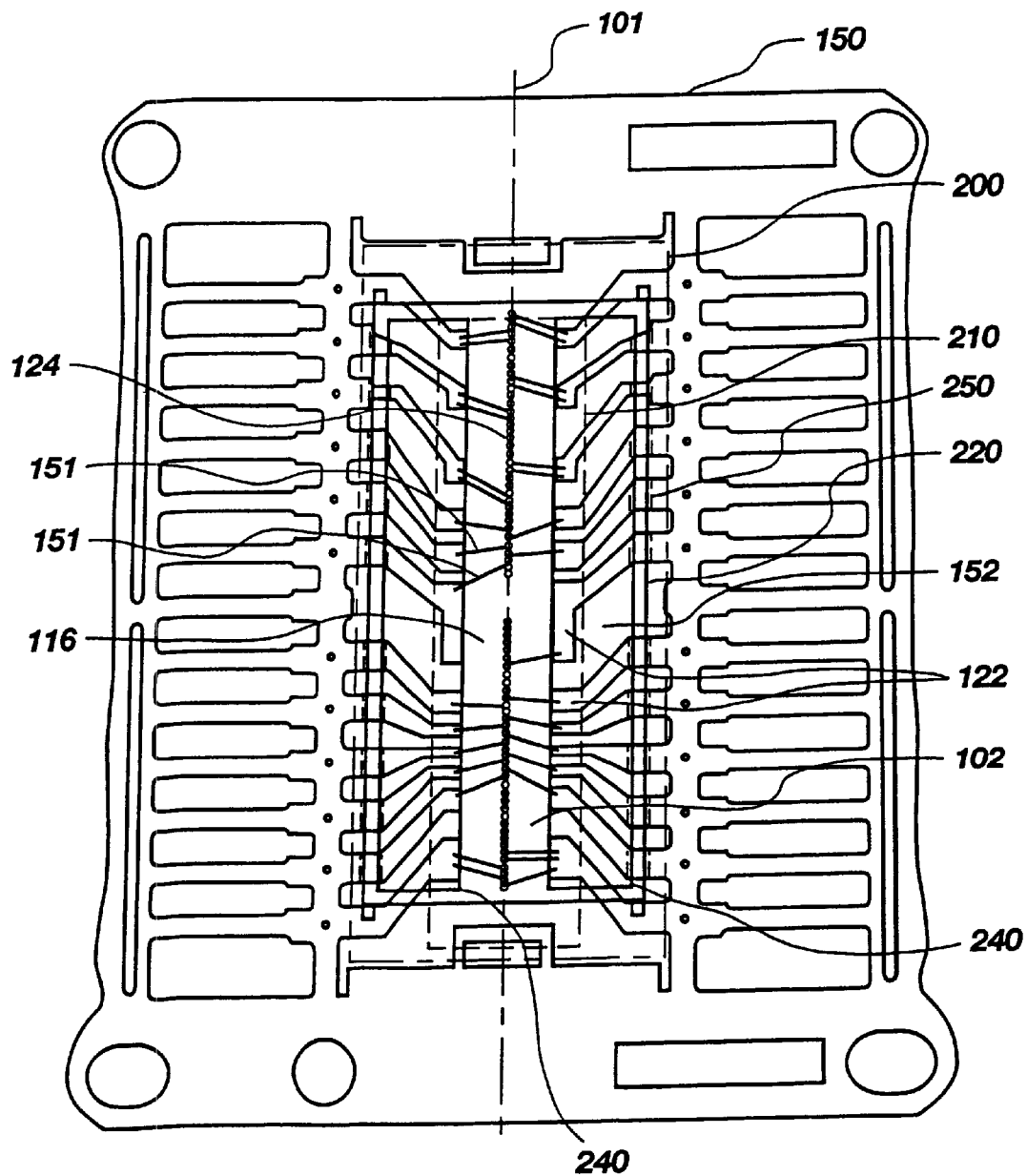
FIGS. 8A and 8B depict top views of a lead frame according to the present invention.
Figure 8B:
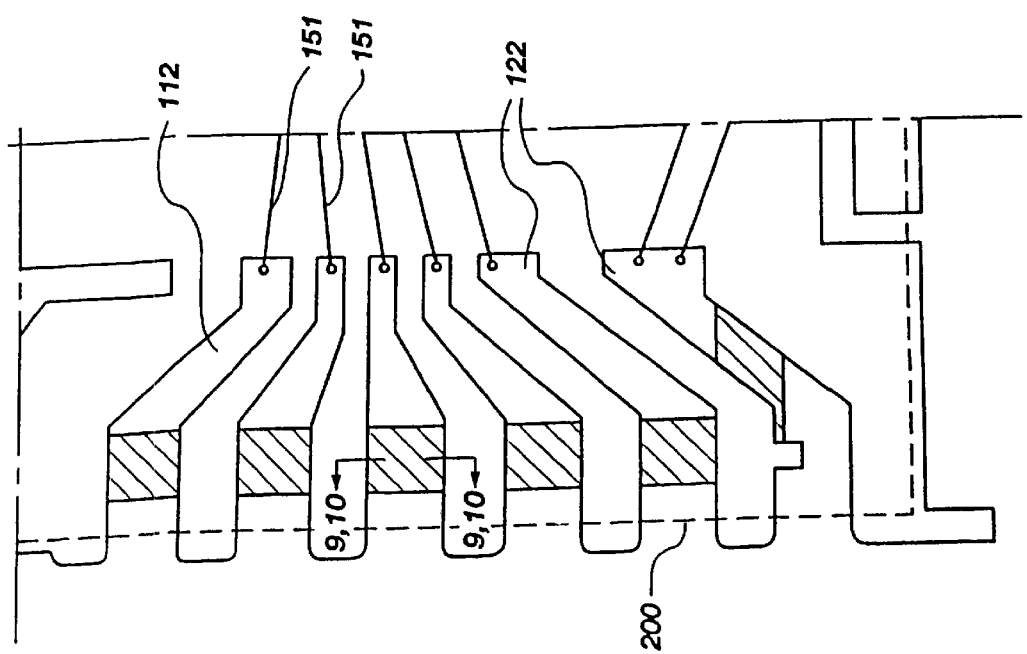

FIGS. 8A and 8B depict views of the lead frame and associated die in accordance with the present invention. For purposes of clarity and perspective, the inner, solid line 220 in FIG. 8A is the periphery of the die onto which the lead frame is superimposed and to which the lead frame is adhesively secured. In FIGS. 8A and 8B, double-dashed line 200 is the outer lateral border of the plastic package to be molded on each lead frame. In FIG. 8A, dashed line 210 represents the portion of the lead ends 122 that are typically plated. The periphery of the adhesive segments disposed between certain leads or buses and the die are represented by inner, solid lines 240. Further, the portion of each lead member that has a stress relief portion formed therein, as described below, is represented by dotted lines 250 in FIG. 8A and cross-hatched for purposes of clarity in FIG. 8B. For purposes of illustration, the semiconductor die as illustrated comprises memory devices, such as dynamic random access memory (DRAM), or static random access memory (SRAM), although the invention has equal utility to any semiconductor device wherein an LOC arrangement is employed.

Figure 10:
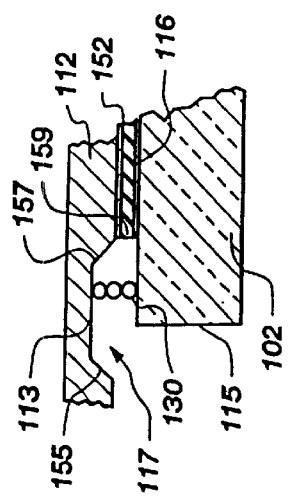
FIG. 10 depicts a partial cross-sectional side view of a forth embodiment of packaged SOJ semiconductor device according to the present invention.
Figure 9:
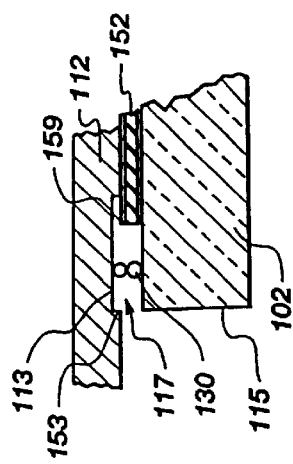
FIG. 9 depicts a partial cross-sectional side view of a third embodiment of packaged SOJ semiconductor device according to the present invention.

FIG. 8A depicts an arrangement wherein a lead frame 150, superimposed on a die 102, is secured thereto with dielectric adhesive strips or elongated segments 152 running along each side of active die surface 116. The inner lead ends 122 of the leads 112 thus extend inwardly over adhesive segments 152 toward a row of bond pads 124 running along the center of the die 100. The inner lead ends 122 are then wirebonded to the bond pads by wires 151. As shown in FIGS. 9 and 10, filler particles 130 that are stacked may become lodged under a lead end 112 may thus cause the free end 121 of the lead 112 to be forced away from the active surface 116 of the die 102. However, the greater the space 117 the less likely it is that filler particles 130 will become stacked in such a way as to cause stress in the lead to die attachment or impinge on the active surface 116 of the die 102.

As illustrated in FIGS. 9 and 10, the recess 113 may be of various sizes and configurations and be located in a variety of positions along the lead 112. In FIG. 9, the recess portion 113 extends a relatively small distance into the lead element 112, forming a substantially rectangular slot. Moreover, the side wall 153 of the recess is substantially coincident with the edge 115 of the die 102. In comparison, the recess 113 shown in FIG. 10 extends farther in depth into the lead element 112, forms a substantially trapezoidal slot and has an angled side wall 155 extending a distance away from the edge 115 of the die 102. Additionally, the angled side wall 157 forming one side of the slot may be adjacent the edge 159 of the tape 152 as shown in FIG. 10 or extend beyond the edge 159 as shown in FIG. 9. In any case, the size and shape of the recess 113 may vary according to the process used to form such a recess. For example, such that etching may form a recess 113 similar to that shown in FIG. 10 and machining may form a recess similar to that in FIG. 9. The improved flexibility of the lead 112 due to recess 113 enhances the lead locking ability of the adhesive strips or segments 152.

Thus, it will be appreciated by those of ordinary skill in the art that several different stress relief arrangements may be employed, as illustrated, with a single lead frame and die design, to create additional space between the active surface of the die and the lead. Moreover, given the known mechanical characteristics of a lead frame of a given material and thickness, as well as the lead configurations, the optimum location and configuration of the stress relief portion may be easily calculated, if required. Further, the minimum cross-sectional area of the lead frame at the location of the stress relief may be calculated. With that explanation, no further design details are believed to be necessary for practice of the invention by those of ordinary skill in the art. CAD (computer aided design) may easily, and preferentially, be employed to make the foregoing determinations and arrive at one more optimum solutions for stress relief locations and lead frame material, thickness and configuration.

While the invention has thus far been described in terms of reducing the incidence of die coat damage due to filler particles, it should also be recognized that the use of the stress relief between the leads and the die enhances the uniformity of the flow front of encapsulant, and reduces the tendency toward formation of voids by promoting flow of the encapsulant over, under and around the leads and over the die surface. It is believed that improved PRT (Preconditioned Reflow Test, also termed a "popcorn" test by virtue of its deleterious effect on substandard package integrity) performance, indicative of reduced levels of moisture in the cured encapsulant, will be realized. However, this has yet to be empirically demonstrated.

The present invention has been disclosed in terms of certain preferred embodiments as illustrated and described herein. However, those of ordinary skill in the art will recognize and appreciate that it is not so limited, and that many additions, deletions and modifications to, and combinations of, the disclosed embodiments may be effected without departing from the scope of the invention as hereinafter claimed. For example, the methods used to form a stress relief may include any known or contemplated method in the art. Multi-layer LOC lead frames such as a two-frame LOC assembly (see above-referenced U.S. Pat. No. 5,461, 255) may be adapted to the present invention. Further, the invention is not limited to a particular arrangement of leads, or to a particular lead cross-section or configuration.

What is claimed is:

1. A semiconductor die assembly encapsulated in plastic having filler material therein having a particle size distribution and an average particle size diameter within the particle size distribution during an encapsulation process in a mold, said die assembly comprising:
    a semiconductor die having an active surface and a plurality of sides;
    at least one adhesive segment having an outer edge and adhering to a portion of said active surface of said semiconductor die; and
    a lead frame including a plurality of lead members, at least one lead member of the plurality of lead members having a lead end portion connected to a portion of the lead frame, having a length, having a thickness, and having a free end portion extending over a portion of said active surface of said die, said at least one lead member including a stress relief portion formed in said at least one lead member of said plurality of lead members, said stress relief portion extending over a portion of said active surface of said die, extending along a portion of the length of said at least one lead member at a location between said free end portion and said lead end portion and extending partially through the thickness of said at least one lead member, said stress relief portion formed in said at least one lead member extending along the length of the at least one lead member from a location proximate the outer edge of said at least one adhesive segment to a location proximate a side of said plurality of sides of said semiconductor die, said stress relief portion providing an enlarged space between a lower surface of said at least one lead member and a portion of the active surface of said semiconductor die, said enlarged space allowing said plastic having said filler material therein having said particle size distribution and said average particle size diameter within the particle size distribution to flow therethrough without said filler material therein substantially damaging said portion of said active surface of said semiconductor die during said encapsulation process of encapsulating said semiconductor device in said plastic having said filler material therein.

2. A semiconductor die assembly encapsulated in plastic having filler material therein having a particle size distribution and an average particle size diameter within the particle size distribution during an encapsulation process in a mold, said die assembly comprising:
    a semiconductor die having an active surface and a plurality of sides;
    at least one adhesive segment having an outer edge and adhesively secured to a portion of said active surface of said semiconductor die; and
    a lead frame including a plurality of lead members, at least one lead member of the plurality of lead members having a lead end portion connected to a portion of the lead frame, having a length, having a thickness, and having a free end portion extending over a portion of said active surface of said die, said at least one lead member of said plurality of lead members having a first portion of the length thereof adhered to said active surface of said semiconductor die and having a second portion of the length thereof extending outwardly over said active surface unadhered thereto, said at least one member having a stress relief portion formed in said at least one lead member of said plurality of lead members, said stress relief portion extending over a portion of said active surface of said die, extending along a portion of the length of said at least one lead member at a location between said free end portion and said lead end portion and extending partially through the thickness of said at least one lead member, said stress relief portion formed in said at least one lead member extending along the length of the at least one lead member from a location proximate the outer edge of said at least one adhesive segment to a location proximate a side of said plurality of sides of said semiconductor die, said stress relief portion providing an enlarged space between a lower surface of said at least one lead member and a portion of the active surface of said semiconductor die, said enlarged space allowing said plastic having said filler material therein having said particle size distribution and said average particle size diameter within the particle size distribution to flow therethrough without said filler material therein substantially damaging said portion of said active surface of said semiconductor die during said encapsulation process of encapsulating said semiconductor device in said plastic having said filler material therein.

3. The die assembly of claim 2, wherein the first portion of the length of said at least one lead member is adhered to said die by at least one adhesive segment having an outer edge thereof, the outer edge of the at least one adhesive segment being located substantially parallel a side of the plurality of sides of said semiconductor die and being located substantially transverse to the length of the at least one lead member.

4. The die assembly of claim 3, wherein said stress relief portion extends along the length of each lead member of said plurality of lead members from substantially the outer edge of said at least one adhesive segment to a location proximate a side of the plurality of sides of said semiconductor die.

5. The die assembly of claim 3, wherein said stress relief portion longitudinally extends along the length of each lead member of said plurality of lead members elements from a position substantially overlaying the outer edge of the at least one adhesive segment to a location substantially beyond a side of the plurality of sides of said semiconductor die.

6. The die assembly of claim 1, wherein said stress relief portion is a recess formed in each lead members of the plurality of lead members.

7. The die assembly of claim 6, wherein said recess is a transverse slot positioned on an underside of each lead member of the plurality of lead members.

8. The die assembly of claim 7, wherein said slot forms a thinned portion along a longitudinal length of each lead member of the plurality of lead members.

9. A semiconductor die assembly encapsulated in plastic having filler material therein having a particle size distribution and an average particle size diameter within the particle size distribution during an encapsulation process in a mold, said die assembly comprising:

a semiconductor die having an active surface and a plurality of sides;

at least one adhesive segment having an outer edge thereof, said at least one adhesive segment being connected to the active surface of said semiconductor die; and a lead frame including a plurality of lead members, at least one lead member of said plurality of lead members having a lead end portion connected to a portion of the lead frame, having a length, having a thickness, and having a free end portion extending over a portion of said active surface of said semiconductor die, wherein a first portion of the length of said at least one lead member is adhered to said die by said at least one adhesive segment having an outer edge thereof, the outer edge of the at least one adhesive segment being located substantially parallel to a side of the plurality of sides of said semiconductor die and being located substantially transverse to the length of the at least one lead member, said at least one lead member having a stress relief portion formed in said at least one lead member of said plurality of lead members, said stress relief portion extending over a portion of said active surface of said die, extending along a portion of the length of said at least one lead member at a location between said free end portion and said lead end portion and extending partially through the thickness of said at least one lead member wherein said stress relief portion formed in said at least one lead member extends along the length of the at least one lead member from a location proximate a side of the plurality of sides of said semiconductor die to a location proximate the outer edge of said at least one adhesive segment, said stress relief portion providing an enlarged space between a lower surface of said at least one lead member and a portion of the active surface of said semiconductor die, said enlarged space allowing said plastic having said filler material therein having said particle size distribution and said average particle size diameter within the particle size distribution to flow therethrough without said filler material therein substantially damaging said portion of said active surface of said semiconductor die during the said encapsulation process of encapsulating said semiconductor in said plastic having said filler material therein.

10. The die assembly of claim 9, wherein said die assembly further includes:

at least one adhesive segment disposed between at least a portion of said lead ends and substantially adhering to a portion of said active surface.

11. A semiconductor die assembly encapsulated in plastic having filler material therein having a particle size distribution and an average particle size diameter within the particle size distribution during an encapsulation process in a mold, said die assembly comprising:

a semiconductor die having an active surface and a plurality of sides;

at least one adhesive segment having an outer edge and adhesively secured thereby connected to a portion of said active surface of said semiconductor die; and a lead frame including a plurality of lead members, at least one lead member of said plurality of lead members having a lead end portion connected to a portion of the lead frame, having a length, having a thickness, and having a free end portion extending over a portion of said active surface of said semiconductor die, said at least one lead member of said plurality of lead members having a first portion of the length thereof adhered to said active surface of said semiconductor die and having a second portion of the length thereof extending outwardly over said active surface unadhered thereto, said at least one lead member having a stress relief portion formed in said at least one lead member of said plurality of lead members, said stress relief portion extending over a portion of said active surface of said die, extending along a portion of the length of said at least one lead member at a location between said free end portion and said lead end portion and extending partially through the thickness of said at least one lead member wherein said stress relief portion formed in said at least one lead member extends along the length of the at least one lead member from a location proximate a side of the plurality of sides of said semiconductor member to a location proximate the outer edge of said at least one adhesive segment, said stress relief portion providing an enlarged space between a lower surface of said at least one lead member and a portion of the active surface of said semiconductor die, said enlarged space allowing said plastic having said filler material therein having said particle size distribution and said average particle size diameter within the particle size distribution to flow therethrough without said filler material therein substantially damaging said portion of said active surface of said semiconductor die during said encapsulation process of encapsulating said semiconductor die in said plastic having said filler material therein.

12. The die assembly of claim 11, wherein the first portion of the length of said at least one lead member is adhered to said die by one adhesive segment having an outer edge thereof, the outer edge of the at least one adhesive segment being located substantially parallel to a side of the plurality of sides of said semiconductor die and being located substantially transverse to the length of the at least one lead member.

13. The die assembly of claim 12, wherein said stress relief portion extends along the length of each lead member of said plurality of lead members from substantially the outer edge of said at least one adhesive segment to a location proximate a side of the plurality of sides of said semiconductor die.

14. The die assembly of claim 12, wherein said stress relief portion longitudinally extends along the length of each lead member of said plurality of lead members elements from a position substantially overlaying the outer edge of the at least one adhesive segment to a location substantially beyond a side of the plurality of sides of said semiconductor die.

15. The die assembly of claim 9, wherein said stress relief portion is a recess formed in each lead members of the plurality of lead members.

16. The die assembly of claim 15, wherein said recess is a transverse slot positioned on an underside of each lead member of the plurality of lead members.

17. The die assembly of claim 16, wherein said slot forms a thinned portion along a longitudinal length of each lead member of the plurality of lead members.

* * * * *

UNITED STATES PATENT AND TRADEMARK OFFICE
CERTIFICATE OF CORRECTION

| | |
|---|---|
| PATENT NO. | : 6,396,131 B1 |
| APPLICATION NO. | : 08/923218 |
| DATED | : May 28, 2002 |
| INVENTOR(S) | : Larry D. Kinsman, Timothy J. Allen and Jerry M. Brooks |

It is certified that error appears in the above-identified patent and that said Letters Patent is hereby corrected as shown below:

| | | | |
|---|---|---|---|
| | COLUMN 1, | LINE 4, | delete "divisional" |
| | COLUMN 1, | LINE 5, | delete "continuation in part" |
| | COLUMN 1, | LINE 6, | after "1996" insert --, now abandoned-- |
| | COLUMN 1, | LINE 12, | after "assembly" delete the comma; add a comma --,-- after "and" and "particularly" |
| | COLUMN 1, | LINE 64, | after "frame" insert a comma --,-- |
| | COLUMN 2, | LINE 2, | delete the comma after "molding" |
| | COLUMN 2, | LINE 6, | change "Alloy 42" to --Alloy 42-- |
| | COLUMN 2, | LINE 27, | change "in" to --on--; change "its" to --their-- |
| | COLUMN 2, | LINE 32, | after "Powdered" insert a comma --,-- |
| | COLUMN 3, | LINE 2, | after "practical" insert a comma --,-- |
| | COLUMN 3, | LINE 67, | after "die" insert a comma --,-- |
| | COLUMN 4, | LINE 1, | after "die" insert a comma --,-- |
| | COLUMN 4, | LINE 38, | after "lead" change "a" to --an-- |
| | COLUMN 4, | LINE 41, | after "lead" change "an" to --and-- |
| | COLUMN 4, | LINE 48, | after "contemplated" delete the comma |
| | COLUMNS, | LINE 11, | after "of" insert --a-- |
| | COLUMN 5, | LINE 14, | after "of" insert --a-- |
| | COLUMN 5, | LINE 19, | after "of" insert --a-- |
| | COLUMN 5, | LINE 22, | after "of" insert --a-- |
| | COLUMN 6, | LINE 56, | delete "(DETAIL A)" |
| | COLUMN 8, | LINE 10, | after "center" insert --101-- and change "die 100" to --die 102-- |
| | COLUMN 8, | LINE 13, | after "112" insert --and-- |
| | COLUMN 8, | LINE 15, | after "117" insert a comma --,-- |
| | COLUMN 8. | LINE 22, | after "lead" delete "element" |
| | COLUMN 8, | LINE 27, | before "112" delete "element" |
| | COLUMN 8, | LINE 42, | after "design" delete the comma |
| | COLUMN 8, | LINE 54, | after "one" insert --or-- |
| CLAIM 5, | COLUMN 10, | LINE 50, | change "members" to --member-- |
| CLAIM 6, | COLUMN 10, | LINE 56, | change "members" to --member-- |
| CLAIM 11, | COLUMN 12, | LINE 20, | after "semiconductor" change "member" to --die-- |

UNITED STATES PATENT AND TRADEMARK OFFICE
CERTIFICATE OF CORRECTION

PATENT NO.         : 6,396,131 B1
APPLICATION NO. : 08/923218
DATED              : May 28, 2002
INVENTOR(S)        : Larry D. Kinsman, Timothy J. Allen and Jerry M. Brooks It is certified that error appears in the above-identified patent and that said Letters Patent is hereby corrected as shown below:

CLAIM 15, COLUMN 15, LINE 55,   change "members" to --member--

Signed and Sealed this

Fourth Day of December, 2007

JON W. DUDAS
*Director of the United States Patent and Trademark Office*

UNITED STATES PATENT AND TRADEMARK OFFICE
CERTIFICATE OF CORRECTION

PATENT NO.         : 6,396,131 B1
APPLICATION NO.    : 08/923218
DATED              : May 28, 2002
INVENTOR(S)        : Larry D. Kinsman, Timothy J. Allen and Jerry M. Brooks It is certified that error appears in the above-identified patent and that said Letters Patent is hereby corrected as shown below:

| | | |
|---|---|---|
| COLUMN 1, | LINE 4, | delete "divisional" |
| COLUMN 1, | LINE 5, | delete "continuation in part" |
| COLUMN 1, | LINE 6, | after "1996" insert --, now abandoned-- |
| COLUMN 1, | LINE 12, | after "assembly" delete the comma; add a comma --,-- after "and" and "particularly" |
| COLUMN 1, | LINE 64, | after "frame" insert a comma --,-- |
| COLUMN 2, | LINE 2, | delete the comma after "molding" |
| COLUMN 2, | LINE 6, | change "Alloy 42" to --Alloy 42-- |
| COLUMN 2, | LINE 27, | change "in" to --on--; change "its" to --their-- |
| COLUMN 2, | LINE 32, | after "Powdered" insert a comma --,-- |
| COLUMN 3, | LINE 2, | after "practical" insert a comma --,-- |
| COLUMN 3, | LINE 67, | after "die" insert a comma --,-- |
| COLUMN 4, | LINE 1, | after "die" insert a comma --,-- |
| COLUMN 4, | LINE 38, | after "lead" change "a" to --an-- |
| COLUMN 4, | LINE 41, | after "lead" change "an" to --and-- |
| COLUMN 4, | LINE 48, | after "contemplated" delete the comma |
| COLUMN 5, | LINE 11, | after "of" insert --a-- |
| COLUMN 5, | LINE 14, | after "of" insert --a-- |
| COLUMN 5, | LINE 19, | after "of" insert --a-- |
| COLUMN 5, | LINE 22, | after "of" insert --a-- |
| COLUMN 6, | LINE 56, | delete "(DETAIL A)" |
| COLUMN 8, | LINE 10, | after "center" insert --101-- and change "die 100" to --die 102-- |
| COLUMN 8, | LINE 13, | after "112" insert --and-- |
| COLUMN 8, | LINE 15, | after "117" insert a comma --,-- |
| COLUMN 8, | LINE 22, | after "lead" delete "element" |
| COLUMN 8, | LINE 27, | before "112" delete "element" |
| COLUMN 8, | LINE 42, | after "design" delete the comma |
| COLUMN 8, | LINE 54, | after "one" insert --or-- |

UNITED STATES PATENT AND TRADEMARK OFFICE
CERTIFICATE OF CORRECTION

PATENT NO. : 6,396,131 B1
APPLICATION NO. : 10/923218
DATED : May 28, 2002
INVENTOR(S) : Larry D. Kinsman, Timothy J. Allen and Jerry M. Brooks It is certified that error appears in the above-identified patent and that said Letters Patent is hereby corrected as shown below:

| | | | |
|---|---|---|---|
| CLAIM 5, | COLUMN 10, | LINE 50, | change "members" to --member-- |
| CLAIM 6, | COLUMN 10, | LINE 56, | change "members" to --member-- |
| CLAIM 11, | COLUMN 12, | LINE 20, | after "semiconductor" change "member" to --die-- |
| CLAIM 15, | COLUMN 15, | LINE 55, | change "members" to --member-- |

Signed and Sealed this

Twenty-fifth Day of December, 2007

JON W. DUDAS
*Director of the United States Patent and Trademark Office*